(12) United States Patent
Rauschnabel et al.

(10) Patent No.: US 6,368,717 B1
(45) Date of Patent: Apr. 9, 2002

(54) COMBINATION ANTIABRASION LAYER

(75) Inventors: Johannes Rauschnabel; Jeanne Forget, both of Stuttgart; Johannes Voigt, Leonburg, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/403,820

(22) PCT Filed: Feb. 23, 1999

(86) PCT No.: PCT/DE99/00483

§ 371 Date: Feb. 4, 2000

§ 102(e) Date: Feb. 4, 2000

(87) PCT Pub. No.: WO99/43865

PCT Pub. Date: Sep. 2, 1999

(30) Foreign Application Priority Data

Feb. 26, 1998 (DE) .......................... 198 08 180

(51) Int. Cl.⁷ .............................. B32B 9/04; B32B 7/02; C08F 2/46; C08J 7/18
(52) U.S. Cl. ...................... 428/447; 428/448; 428/212; 428/217; 428/908.8; 427/488; 427/489; 427/492
(58) Field of Search ................. 428/447, 212, 428/217; 427/492, 487–552

(56) References Cited

U.S. PATENT DOCUMENTS

| 5,679,413 A | | 10/1997 | Daniels et al. |
| 5,718,967 A | * | 2/1998 | Hu et al. .................... 428/216 |
| 6,130,002 A | * | 10/2000 | Neumann et al. ........... 428/698 |

FOREIGN PATENT DOCUMENTS

| CA | 1 337 484 | 10/1995 | |
| DE | 44 41 313 | 5/1996 | |
| EP | 0 718 418 | 6/1996 | |
| JP | 63 259069 | 10/1988 | |
| WO | 95/16799 | 6/1995 | |
| WO | WO-97/23661 | * 7/1997 | ........... C23C/14/06 |

OTHER PUBLICATIONS

Ullmanns Encyclopedia of Industrial Chemistry, vol. A20, pp 755–756, 5$^{th}$ edition, (1992).
Yasuda, H. et al., "Plasma Polymerization," 4 Comprehensive Polymer Science., pp. 357–375.*
"Plasma Polymerization," 11 Encyclopedia Polymer Science Engineering, pp. 248–261.*
von Gerhard Benz, "Schutzschichten durch Plasmapolymerisation," Bosch Technische Berichte 9, 1986/87, VDI–Bildungswerk, 1990.*
Plein, P., "Plasmapolymerisation," pp. 108–114, 1989.*

* cited by examiner

Primary Examiner—Robert Dawson
Assistant Examiner—Michael J Feely
(74) Attorney, Agent, or Firm—Kenyon & Kenyon

(57) ABSTRACT

A combination wear protection film for components made of substrates susceptible to wear is described. The film has a wear-resistant surface film that contains one or more of the elements carbon, nitrogen, or boron, the proportion of this element—or, if more than one of these elements is present, the sum of the proportions of the elements present—is at least 30% by atomic weight, preferably at least 40% by atomic weight; and a support film, located between a substrate and the surface film and made of a plasma polymer, that exhibits a quasi-continuous transition in modulus of elasticity and optionally in hardness from a value of a base film to a value of the surface film. A method for producing a wear protection film of this kind, and objects equipped with the wear protection film is also described.

20 Claims, No Drawings

COMBINATION ANTIABRASION LAYER

FIELD OF THE INVENTION

The present invention relates to a combination wear protection film and methods for generating and using the combination protection film in technical devices, in particular mechanical energy transfer mechanisms.

BACKGROUND INFORMATION

Practically all objects are subjected to a greater or lesser degree of wear due to interactions with their environment. As a rule, this wear results over time and decreases in the utilitarian value or functionality of the object. Efforts have therefore always been made to configure technical components, i.e. objects having a technical function, in such a way that when used as intended they exhibit as little wear as possible and thus can fulfill their purpose for as long as possible.

Depending on the manner in which they interact with their environment, components are subjected to very different wear stresses that are to be counteracted with very different measures.

In the case of components that do not need to transmit any appreciable energy, wear occurs essentially due to the action of light, air, climatic influences, and/or particle impact. The principal task here is to equip the objects with nonporous, scratchproof surfaces. One conventional method that equipped a wide variety of surfaces with polymer coatings is the plasma polymerization method. In this method, a plasma is generated by electrical excitation in a high vacuum using saturated or unsaturated compounds that can be vacuum-evaporated. From the monomer compounds, fragments such as gaseous radicals, radical ions, ions, and excited molecules form in the plasma and are deposited onto a substrate, on which they form a highly crosslinked polymer film that constitutes a sealed coating. Detailed information about implementation of this method is provided, for example, in Ullmanns Encyclopedia of Industrial Chemistry, Vol. A20, pages 755–756, 5$^{th}$ ed. and the literature cited therein, Comprehensive Polymer Science 4, pp. 357–375 and Encyclopedia Polymer Science and Engineering. 11, pp. 248–261.

An interesting possibility, based on this method, for depositing a transparent scratchproof coating onto plastics such as polymethyl methacrylate or polycarbonate—as used, for example, in the manufacture of automobile headlights—is Schutzschichten durch Plasmapolymerisation (Protective Film Using Plasma Polymerization) of Bosch Technische Berichte (Bosch Technical Reports) 8 1986/87 published in Handbuch Plasmapolymerisation (Plasma Polymerization Manual), VDI-Bildungswerk (VDI Education Text), 1990. According to. this publication, plasma polymerization of HMDS(O) is used to produce on the plastic surface a plasma polymer film that is relatively soft directly on the plastic surface, but becomes harder and harder with increasing thickness and terminates in a hard, quartz-like surface film. In practical terms, this hardness gradient is produced by the fact that plasma polymerization is initially performed in the presence of very little oxygen, and the oxygen partial pressure is continually raised as the film thickness increases.

Conditions are even more complex in mechanical energy transfer systems, which have components that are exposed not only to the kind of mechanical stress that occurs in the case of headlight but also to lenses, for example stone impact, abrasion wear particularly high and complicated loads. Components of this kind are exposed to shear forces, impact stresses, high pressures, and in particular to sliding frictional forces as well as long-term vibratory effects, which act on the elements either individually or (as a rule) simultaneously, albeit to different degrees, and result in more or less rapid wear.

One solution that at first glance appears obvious—i.e. to manufacture all the functional elements from materials that can withstand the various wear stresses—runs into considerable and often insurmountable difficulties, either because such materials are not conventional for suitable materials are much too expensive or very difficult or impossible to shape or machine into the desired components.

Many attempts have therefore been made to manufacture the functional elements of mechanical energy transfer systems as well from easily shaped and (whenever possible) also inexpensive materials, and to impart the necessary wear resistance to them by way of a surface finish.

Different protective measures are necessary depending on the type of effect that causes the wear. It is conventional, for example, for drills not only to be equipped with hard metal cutting edges, but also vacuum-coated with hard-material coatings, for example titanium nitride. In highly stressed energy transfer elements, however, very high demands are placed on these surface protective coatings. Desirable properties include, for example, good adhesion to the component, good cohesion and minimal stress within the film, high hardness and load-carrying capability, minimal coefficient of friction, good surface smoothness, and minimal adhesion to the countermember. In general, homogeneous hard-material films on wear-affected substrates cannot meet this aforesaid combination of criteria. Methods have therefore already been described for producing combination films that can be better adapted to requirements.

International Published Patent No. WO 95/16799 describes components equipped, for protection against wear, with a hard-material film that is composed of an adhesion film in contact with the component, a functional film thereabove, and a surface film. The adhesion film comprises a titanium composition, in particular titanium boride, or, if the component comprises a metallic substrate, pure titanium. The functional film is made up in turn of three films of hard-material alloys (titanium nitrides, titanium carbides, and/or titanium borides) of various composition, for example titanium nitride, titanium carbonitride, and titanium carbide, or titanium boronitride, titanium boronitride carbide, and titanium borocarbide, with gradual transitions in composition between the films.

The individual films are obtained by successively vacuum evaporating the titanium compositions, in accordance with a predetermined schedule, onto the substrate while simultaneously allowing high-energy (and, in particular, heavy) ions to act on it. The coating temperature for this method is approx. 200° C. The surface film comprises a metal-containing carbon film (i-C(Ti)), and optionally also a metal-free carbon film (a-C:H) thereabove.

Film deposition in combination with heavy ion bombardment solves adhesion and film separation problems.

For some time, efforts have been made to replace expensive and/or difficult-to-machine materials with more favorable materials, e.g. roller bearing steel, for the manufacture of mechanically stressed components. In the context of these efforts, many attempts have also been made to fabricate components with a technical function from plastics. Plastics not only have the advantage of economical accessibility, but are also available in many different types, can be made into almost any desired shape, and have advantageous physical properties, e.g. favorable internal damping or resonance, which means they have little tendency to generate, accept and transmit vibration. This property not only prevents fatigue wear, but also results in particular low operating noise.

In cases in which no appreciable mechanical loads occur, it has also been possible to create sufficient surface protection, for example by applying (as described above) a scratch protection film of $SiO_2$.

In the case of mechanically stressed components, however, the wear properties of the more favorable materials are often inadequate. As discussed above, in such cases an attempt is made to achieve the necessary wear resistance for the components by way of a thin coating. In the case of plastics as an economical material for wear-stressed components (i.e. gears or friction clutches), hard films must be applied onto these components.

Since high-temperature tolerance plays a role in the coating process for many materials, and in particular for plastics, it is necessary to use coating methods that are performed at relatively low temperatures and in which the film deposition rates are great. Many coating methods that are used for finishing metal surfaces are therefore unusable for coating plastics.

It has been found that uniformly hard films are too brittle, and chip off from plastic substrates in response even to the small pressure stresses that accompany most wear stresses (this behavior is called the "eggshell effect"). To get around this shortcoming, it is necessary to create a hardness gradient within the film; in other words, the film hardness must be adjusted so that it gradually increases from the flexible plastic base to the hard surface film that is exposed to wear. This principle has been implemented in the aforementioned method, described in the Bosch Technical Reports, for coating plastics with a transparent $SiO_2$ scratch-protection film.

These conventional plasma polymer films with a hardness gradient have the disadvantage of insufficient resistance to other wear stresses, in particular to friction wear stresses. Their advantage lies essentially in scratch protection for relatively soft plastic components and in the transparency of the films, so that the coating is also a possibility for optical applications.

Amorphous carbon films exhibit outstanding wear protection properties with high hardness. They also exhibit low coefficients of friction in sliding wear tests. These films cannot yet, however, be applied at deposition rates on the same order of magnitude as those known from plasma polymerization.

Metal-containing carbon films, e.g. i-C(WC), also offer good frictional and vibratory wear protection, but because the deposition rate is again much lower than in the case of a plasma polymer coating process, and the level of thermal stress is high, they can be applied to only a few (usually expensive) types of plastic. In addition, protection against impact wear stress would require particularly thick film systems, precisely adjusted in terms of modulus of elasticity, that cannot be applied onto ordinary types of plastic by pure carbon coating.

The deposition of hardness-gradient films is possible in carbon systems, but cannot be adapted to very soft substrates, in particular to plastics, since the very soft, graphite-like carbon films necessary for the purpose have insufficient mechanical load-carrying capability at the base of the film, i.e. exhibit poor adhesion under normal and shear loads.

SUMMARY OF THE INVENTION

It has now been found that, surprisingly, it is possible to join certain hard-material films, in particular those based on metal-containing and metal-free carbon, in immovable and permanent fashion to surfaces of soft materials, in particular plastic surfaces, by way of a plasma polymer film support film having defined hardness and elasticity properties. The materials coated according to the present invention with hard-material films exhibit advantageous wear properties.

The surface film—for example a carbon film that can be of metal-containing or metal-free configuration—predominantly determines the frictional, vibrational, and abrasive wear protection of the combination film, while the support film influences the impact wear protection of the film package, so that overall, very good protection is achieved against frictional and fatigue wear even on components subject to high levels of tribological stress. The surface films of the protective coatings according to the present invention have a very good affinity for lubricants because of their carbon content, so that lubrication film detachment is largely avoided. In addition, carbon films exhibit dry lubrication properties, i.e. film abrasion can produce a kind of lubricating bushing on the tribological partner. They can also be varied in terms of their topography (particle size, surface roughness, porosity) in such a way that on the one hand very good resistance to cavitation wear is achieved, and seizing of sliding surfaces is also prevented.

The use of the plasma polymer film in this multi-level film configuration makes it possible to adapt hardness and elasticity moduli between the substrate and wear protection film, which results in higher ductility and very good adhesion of the films even on soft plastics.

The high deposition rates possible with the plasma polymer process allow short process times, which in turn permit a greater unit throughput for a given basic capital cost. This means that amortization of the capital investment is distributed over more components, thus reducing the per-unit cost.

With the use of plasma polymer support films it is thus possible to work economically and at relatively low coating temperatures. Because of the coating costs associated with them, this is particularly important for mass-produced components, e.g. the plastic gears of actuating gear drives or electric tool drives.

The combination wear protection film according to the present invention for components made of substrates susceptible to wear, in particular of plastics or soft metals, comprises a wear-resistant surface film and a support film, located between substrate and surface film, that provides a transition over its thickness from the relatively soft base level of the support film resting on the substrate to properties of the surface film. The surface film contains one or more of the elements carbon, nitrogen, silicon, or boron, the proportion of the carbon, nitrogen, or boron—or, if more than one of these elements is present, the sum of the proportions of these elements—is at least 30% by atomic weight, preferably at least 40% by atomic weight; and that the support film is made of a plasma polymer that has been deposited from a silicon-organic compound and/or an aliphatic and/or an aromatic carbon compound; and that the support film exhibits a quasi-continuous transition in modulus of elasticity and optionally in hardness from the value of the base film to the value of the surface film.

A "quasi-continuous transition" for the purposes of the present invention means either that the modulus of elasticity and/or the hardness of the film forms a gradient that can be represented as a continuous curve, such that this curve need not have the same slope at all points but must not exhibit any discontinuity points relevant to strength (i.e. no substantial breaks); or that a multi-step transition from the soft base to the hard surface film is generated by way of a package made up of a plurality of individual films whose modulus of elasticity and/or hardness changes slightly and in directed fashion from one film to the next.

The composition of the surface film is selected so that it is hard and/or possesses friction-reducing and/or dry lubricating properties, and protects the substrate from mechanical wear.

The films and film levels can contain further elements, preferably hydrogen, oxygen, and metals, in addition to the aforesaid elements.

In the surface film in particular, metal dopants can be used to modify the film properties and thus for optimal adaptation to the intended area of application.

Preferably the surface film is made entirely or predominantly, in particular at a proportion of more than 60% by atomic weight, of carbon, and at a proportion of up to 40% by atomic weight of nitrogen, boron, silicon, and/or metals. Surface films that contain more than 75% by atomic weight, in particular more than 85% by atomic weight, of carbon are particularly preferred.

Also particularly preferred are surface films that contain at least 60% by atomic weight carbon in combination with at leas 2% by atomic weight, preferably at least 10% by atomic weight, in particular at least 20% by atomic weight of one of the aforesaid elements, nitrogen, silicon, boron, or metals.

The properties of the protective films according to the present invention that are so valuable in terms of application engineering result from the interaction of the mechanical properties of the support film and surface film, which in turn are based on their physical composition and the structure that is created under the deposition conditions.

The plasma polymer films of the wear protection films according to the present invention are made of highly crosslinked polymer compounds that exhibit a more or less statistical structure, meaning that in them, the atoms participating in their configuration do not, as in simple monomers or polymers, need to have a simple integral correlation with one another. Fractional and mutually independent atomic indices, such as $SiC_{1.9}N_{0.3}B_{1.1}$, may therefore appear in the empirical formulae. This has the great advantage that it is possible to adjust the stoichiometric composition of the polymer film as required in the various levels, and to modify it as desired over the film thickness, either continuously or in small steps that do not impair strength.

The components including nitrogen, boron, silicon, and metals form, with the carbon and among themselves, compositions in which all the phases possible under the film formation conditions can be present. For example, nitrogen, boron, and silicon can be partially incorporated into the three-dimensionally crosslinked structure of the plasma polymer, or can be present, for example, as nitride or carbide phases or as mixed phases thereof.

Depending on the deposition conditions, metals can also be incorporated into the polymer or can be present as nitride, carbide, or boride phases, but also in unbound form.

In view of the large number of structures that are possible in the individual levels of the support film and the surface film, a person skilled in the art could not have predicted the outstanding properties of the wear protection films according to the present invention.

All metals, with the exception of the first main group of the periodic system, are in principle suitable for modification of, in particular, the surface film properties. Advantageously, metals of the second to fifth periods of main group 3, the metals of the fourth through sixth main groups, and the adjacent group metals, are used. Metals of the adjacent groups, in particular those of the fourth period, are preferred. Tantalum, titanium, tungsten, and chromium are particularly preferred.

Suitable metal compounds are, in particular, metal carbides, and/or nitrides and/or carbonitrides and/or borides and/or boronitrides of the aforementioned metals. The proportion of metal atoms and/or metal compounds, in terms of metal, in the surface film is up to 40% by atomic weight. Preferably it is in the range from 1 to 30% by atomic weight, in particular from 5 to 30% by atomic weight.

The plasma polymer support film also can contain metal atoms or metal compounds, in particular if it is advantageous for adaptation of its physical data to those of the surface film. The base level of the support film advantageously is made of a plasma polymer that exhibits high adhesion to the material of the substrate. This can be achieved, for example, by the fact that the base level of the support film is made of a plasma polymer that exhibits, in terms of its modulus of elasticity, hardness, and deformability, a coordination with the material of the substrate that is sufficient to attain good adhesion.

In order to achieve particularly good adhesion properties between the support film and the relatively soft substrate, it has proven advantageous for the base level of the support film to be made of a plasma polymer whose stoichiometric composition differs only slightly from the stoichiometric composition of the monomer being delivered. Preferably the base level of the support film is made from a plasma polymer of a silicon-organic compound.

Further criteria that promote good adhesion between the substrate and the base level of the support film include the fact that the base level of the support film is made of a plasma polymer that has functional groups identical or similar to the material of the substrate, or whose functional groups can interact with substituents on the substrate surface. If a soft metal is to be coated according to the present invention, it is advantageous if the base level of the support film is made of a plasma polymer that contains polar groups with an affinity for metal. It is of course also possible to apply, between the surface of the substrate and the base level of the support film, an additional adhesion-promoting film made of a material that has an affinity both with the substrate and with the material of the base level of the support film. An adhesion-promoting film of this kind advantageously has a thickness of 5 to 100 nm, preferably 10 to 50 nm.

In order to achieve particularly good wear protection properties in the surface film, it is advantageous for the support film to have, at least in a film level region directly below the surface film, a gradient in its stoichiometric composition that terminates in the stoichiometric composition of the surface film, since this generally results in a smooth transition in elasticity properties from the support film to the surface film.

For example, in the case of a surface film according to the present invention having a carbon surface film, an elastic, firmly adhering support film can be achieved by the fact that the carbon content, proceeding from the base level, increases with increasing film thickness up to that of the surface film. The transition from the stoichiometry and modulus of elasticity of the plasma polymer film to that of the carbon film is thus smooth or takes place in a plurality of small steps.

For example, the film base is made of a Si—C plasma polymer or a Si—C—O plasma polymer; this is followed by a carbon gradient that continues to the carbon surface film. Of course the total content of the other film constituents then constitutes a gradient opposite to the carbon content, since the sum of all the constituents must always add up to 100%.

The most important criterion for a good wear protection film according to the present invention is the quasi-continuous transition in elasticity data (and optionally in hardness data) from the base level of the support film to the surface film. This transition need not necessarily be brought about by a continuous transition in carbon content or in the content of another individual film constituent extending from the base level to the surface film. It is also possible for several of the film constituents, for example carbon, oxygen, nitrogen, or boron, to exhibit content gradients running in the same direction, if the remaining constituents result in their totality in an opposite content gradient of equal magnitude. It is also possible—and particularly advantageous depending on the composition of the base level and of the surface film—to implement the continuous transition in elasticity properties from the base level to the surface film by way of a sequence of concentration gradients of different film constituents in different film level regions. Examples of such stepped content gradients are the following film structures:

The base level is constituted by a Si—C—O plasma polymer that is followed by an oxygen gradient. Adjoining this is a transition to a high nitrogen content, and following that, via a carbon gradient, is the carbon surface film.

In another embodiment, the base level of the support film comprises a Si—C—N plasma polymer and transitions in a gradient to a high nitrogen content; succeeding this is a transition to a high carbon content that ends in a carbon surface film.

In a further embodiment, the base level is made of a Si—C—O plasma polymer or a Si—C—N plasma polymer; this is followed by a gradient with nitrogen or boron that transitions into a boron nitride or Si—N—B surface film with or without carbon. As already described above, all these variants can contain metal atoms or metal compounds, for example TiN, in the support film but in particular in the surface film.

Doping with Si, B, N, O, or any desired metal atoms in a carbon surface film is also possible.

The wear protection films according to the present invention are produced by conventional methods of plasma. If desired, a PVD deposition operation, for example using a sputtering process, can also be performed simultaneously or subsequently. According to the present invention, plasma polymerization is performed in such a way that, optionally after application of an adhesion-promoting film or after plasma finish cleaning (plasma etching) and/or plasma activation of the substrate surface, a monomer gas or a monomer gas mixture, comprising one or more gaseous silicon-organic compounds and/or aliphatic and/or aromatic carbon compounds, and optionally further compounds containing doping elements, is delivered to the plasma, resulting in plasma-induced deposition onto the substrate of a polymer film that becomes crosslinked. The polymerization conditions and the monomer gas composition are advantageously selected, on the basis of a predetermined program identified in preliminary tests, in such a way that in each film level produced in the structure of the film, the stoichiometric composition provided therefor is achieved.

In many it is advantageous to select the polymerization conditions at the beginning of the deposition process in such a way that the soft film base approaches, in its stoichiometry, that of the monomer that is used.

All compounds with sufficient vapor pressure at temperatures between 20 and 200° C. are in principle suitable for building up the plasma polymer films; vapor pressures of approximately 10 to 0.001 mbar are to be regarded as sufficient.

Organosilicon compounds, including those containing oxygen, nitrogen, or boron, are generally preferred as monomers for building up the wear protection film according to the present invention. Suitable compounds of this kind are found in the class of the poly(organosilanes), poly(siloxanes), poly(carbosilanes), poly(organosilazanes), and poly(carbosilazanes). Examples of such monomers are tetramethylmonosilane, tetraethylmonosilane, methyldiphenylmonosilane, trimethylmonosilanol, diethyoxydimethylmonosilane, or hexamethylcyclotrisiloxane. Particularly preferred as the monomer material containing silicon are representatives of the poly(organosilanes) and poly(siloxanes), in particular hexamethyldisilane (HMDS), hexamethyldisiloxane (HMDSO), tetraethylorthosilicate (TEOS), and divinyltetramethyldisiloxane ($VSi_2$).

Monomer gases suitable for the deposition of C—H films are saturated or unsaturated, branched or unbranched aliphatic hydrocarbons, advantageously those with 1 to 8, preferably with 1 to 4 carbon atoms, or aromatic hydrocarbons, preferably with 6 to 14 carbon atoms. Examples of suitable hydrocarbons are alkanes, e.g. methane, ethane, propane, butane, isobutane, octane, isooctane; alkenes, e.g. ethene, propene; alkynes, e.g. acetylene; and aromatics, e.g. benzene, toluene, xylene. Preferred hydrocarbons are methane, ethane, and acetylene.

If elements other than C, H, and Si are to be incorporated into the plasma polymer, it is possible in principle to use monomers based on the aforementioned classes that contain these additional elements as substituents or as chain members. For cost reasons, however, it is much more advantageous to incorporate these elements statistically into the plasma polymer, once it has been produced, by adding simple gasifiable compounds of these elements to the gas flow that is delivered to the plasma. For example, oxygen and nitrogen can be introduced into the polymer by adding oxygen, nitrogen, ammonia, or nitrous oxide. Gradual adaptation of the stoichiometry of the support film to a carbon surface film can be accomplished, for example, by adding carbon-containing additional gases, for example methane, ethylene, or acetylene, to the monomer gas flow. Also suitable for incorporating other elements into the polymer and implementing the content gradients are, besides oxygen, nitrogen, ammonia, methane, ethylene, or acetylene, boron compounds such as boric acid esters, boranols, or boranes, and nitrogen in the form of compounds containing amino or amido groups, for example acrylonitrile, and oxygen in the form of water, or mixtures of the aforesaid substances, as well as gasifiable metal compounds, preferably from the series of lower metal alkoxides such as aluminum, zirconium, and titanium alkoxides, for example zirconium (IV) tert-butoxide, titanium(IV) tert-butoxide, aluminum triethoxide, and from the series of metal carbonyls, for example tungsten hexacarbonyl.

It is particularly advantageous, however, to achieve metallic and nonmetallic dopants in the wear protection film according to the present invention by way of a PVD deposition operation occurring concurrently with the plasma polymerization process or performed subsequent thereto, for which a sputtering process, for example magnetron sputtering, pulsed magnetron sputtering, DC sputtering, high-frequency sputtering, or hollow cathode gas-flux sputtering can be used.

Any metallic, nonmetallic, oxide, boride, carbide, silicide, or nitride target materials can be used in this situation.

The structure and composition of the wear protection films according to the present invention and their levels can be controlled not only by the nature and quantitative relationships of the monomer gases, but also by the process conditions. For example it is also possible, via a smooth change in the process conditions toward a higher carbon content, to achieve a continuous transition from the composition and structure of a base level to a carbon surface film. Process conditions that can be defined in order to control the thickness, structure, and composition of the film levels are the overall process pressure; the monomer partial pressure; the flow velocity of the gas mixture and, associated therewith, the monomer flow rate; the temperature of the gas mixture and substrate; the spacings and geometry of the gas inlet, plasma region, and substrate; the plasma energy and excitation frequency; and the coating time. The plasma energy, working temperatures, substrate spacing, and pressure conditions offer particularly effective opportunities for influencing the film structure. For example, elevating the plasma energy and the substrate temperature results in harder polymer deposits; elevating the process pressure results in softer deposits with less thickness. Selection of the spacing between plasma and substrate, the concentration of oxygen or reactive gas in the gas mixture, the plasma power, and the substrate temperature can also be used to establish a desired topography for the polymer films, in particular the surface film. Lowering the proportion of oxygen or reactive gas, the plasma power, and the substrate temperature, and elevating the substrate spacing from the plasma, each result in a coarsening of the film surface, and vice versa. If other conditions are kept constant, an elevation in plasma energy also results in polymer films with greater chemical resistance. It is normal to work with an energy input of 100 to 6000 W, preferably 200 to 1000 W, to establish the working pressure at values between 5 and 0.01 mbar, preferably 1 to 0.025 mbar, and to establish the substrate temperature at between 20 and 200° C., preferably between 20 and 120° C.

To assist film deposition, a bias voltage can be applied, capacitatively or by direct contact, to the substrate. The bias voltage can be operated in a pulsed or unpulsed fashion; in the pulsed case, monopolar or bipolar pulsing is possible. The pulse frequency can be varied within wide limits. It is advantageous to select a pulse frequency between 1 kHz and 100 MHz, preferably between 20 kHz and 50 MHz, in particular between 50 kHz and 20 MHz. For design-related reasons, pulse frequencies below 27 MHz, e.g. a radio frequency of 13.56 MHz, are advantageous.

The monomer compositions and process parameters necessary for the deposition of a polymer film with a specific stoichiometry, physical properties, and topography are ascertained on the basis of series of preliminary tests. These involve systematically performing plasma polymerization tests with various monomers and monomer compositions and different process parameters, and measuring the stoichiometric and physical data of the polymer deposits thereby obtained. This yields the properties of the polymer films for each monomer combination as a function of the process parameters; these can be represented, for example, in the form of calibration curves from which can be derived the control program for the process conditions necessary for creating a plasma polymer film having, for example, a specific elasticity gradient.

The stoichiometric composition of the plasma polymer films can be ascertained in known fashion by XPS analysis. Determination of the hardness and elasticity can also be accomplished using known methods: hardness determination is accomplished, for example, using the method described in P. Plein, "Plasmapolymerisation" (1989), pp. 112–114, in which the force that must be exerted on a diamond tip in order to produce a scratch on the test surface serves as the measured variable that allows, by way of calibration measurements, a determination of the hardness of the surface under test. The method is relatively imprecise, but when performed under conditions that are kept as constant as possible has the accuracy necessary for the preliminary tests to be performed here. The elasticity determination can be performed using a measurement method also cited in P. Plein, "Plasmapolymerisation" (1989), pp. 108–110 and disclosed by K. Taube (seminar presentation of Nov. 25, 1987, Philips Research Laboratory, Hamburg, "Measuring the Mechanical Properties of Thin Films"). In this, a diamond tip is applied onto the film with a force such that it penetrates to a certain depth (not more than 20% of the film thickness), but does not produce any plastic deformation of the surface. The application force is then modulated in a sine-wave pattern and the corresponding changes in penetration depth are measured.

The values for penetration depth and change in force can be used to calculate the modulus of elasticity.

The plasma necessary for generating the wear protection film according to the present invention can be a pulsed or unpulsed microwave plasma with or without magnetic field support (ECR), or a plasma excited by high or medium frequency, in particular radio frequency (e.g. 13.56 MHz), or created by hollow cathode excitation. The use of a microwave plasma is particularly preferred, since it allows the highest deposition rates to be achieved. The method of pulsed or unpulsed magnetron sputtering is particularly suitable for implementing a simultaneous or subsequent sputtering process. The present invention furthermore relates to the objects equipped with a wear protection film according to the present invention; and the use thereof as components in technical devices, in particular in mechanical energy transfer mechanisms.

The exemplary embodiments below illustrate the manner in which wear protection films according to the present invention are produced.

EXEMPLARY EMBODIMENTS

Example 1

In a vacuum vessel with a microwave source and an adjustable and rotatable substrate holder, a drive gear made of polyetheretherketone (PEEK), whose surface had been cleaned by plasma etching with oxygen (30 sec at 600 W microwave power and 100 sccm oxygen flow) was coated in the region of the teeth, while continuously rotating, under the following conditions:

After the admission of 400 sccm gaseous HMDS(O), a plasma was ignited with 500 W microwave power. After a polymerization time of 10 minutes, the HMDS(O) portion in the gas flow was reduced uniformly to zero over a 5-minute period, and over the same period acetylene was introduced into the gas flow, uniformly increasing from 0 to 100% by volume. During this period, the microwave power was increased from 600 to 800 W. After completion of the monomer gas concentration modification program, polymerization was continued for a further 10 minutes at the final flow rate of 200 sccm acetylene.

The gear coated according to the present invention was then removed from the vessel. It had in the region of the teeth a wear protection coating according to the present invention 16 µm thick, comprising a support film and, deposited thereon, a very hard, nonporous carbon surface film.

The support film had in the base level a carbon content of 30% by atomic weight, a silicon content of 40% by atomic weight, an oxygen content of 20% by atomic weight, and a hydrogen content of 10% by atomic weight. Measured over its thickness, it had a positive carbon content gradient that culminated in the surface film's carbon content of 90% by atomic weight. The protective film according to the present invention exhibited outstanding resistance to frictional, vibrational, and abrasive wear and to impact wear. It was moreover very hard and accordingly scratchproof, and exhibited a good affinity for lubricants.

Example 2

Example 1 was repeated, with the difference that during the period after completion of the monomer gas concentration modification program and during the continued plasma polymerization using 100% by atomic volume acetylene, a PVD deposition operation was simultaneously performed using a titanium target.

The resulting protective film according to the present invention contained, in the surface film, 10% by atomic weight titanium in the form of i-C(Ti). It exhibited even slightly greater resistance to abrasion, and a much higher resistance to frictional wear, than the film produced in Example 1.

What is claimed is:

1. A combination wear protection film for a component made of a substrate susceptible to wear, the substrate including one of plastic and soft metal, the combination wear protection film comprising:
    a wear-resistant surface film containing at least one of carbon, nitrogen, silicon and boron, the at least one of carbon, nitrogen, and boron being at least 30% by atomic weight of the surface; and
    a support film positioned between the substrate and the surface film, the support film having a thickness and providing a transition over the thickness from a relatively soft base level of the support film resting on the substrate to properties of the surface film, the support film being made of a plasma polymer deposited from at least one of a silicon-organic compound, an aliphatic carbon compound and an aromatic carbon compound, the support film having a quasi-continuous transition in modulus of elasticity from a first value of the base level of the support film to a second value of the surface film.

2. The combination wear protection film according to claim 1, wherein the support film exhibits a quasi-continuous transition in modulus of hardness from a hardness value of the base level of the support film to a hardness value of the surface film.

3. The combination wear protection film according to claim 1, wherein the at least one of carbon, nitrogen, silicon and boron is at least 40% by atomic weight of the surface film.

4. The combination wear protection film according to claim 1, wherein the surface film contains at least one of hydrogen, oxygen, and metals.

5. The combination wear protection film according to claim 1, wherein the surface film contains more than 60% by atomic weight of carbon and up to 40% by atomic weight of at least one of nitrogen, boron, silicon and metals.

6. The combination wear protection film according to claim 1, wherein the base level of the support film is made of a plasma polymer exhibiting high adhesion to a material of the substrate.

7. The combination wear protection film according to claim 1, further comprising:
    an adhesion-promoting film positioned between a surface of the substrate and the base level of the support film.

8. The combination wear protection film according to claim 1, wherein at least in a film level region directly below the surface film, the support film exhibits a gradient in a stoichiometric composition that terminates in a stoichiometric composition of the surface film.

9. A method for producing a wear protection film by plasma polymerization, comprising:
    providing a substrate composed of one of plastic and a soft metal; and
    delivering one of a monomer gas and a monomer gas mixture to a plasma, the one of the monomer gas and the monomer gas mixture including at least one of i) at least one gaseous silicon-organic compound, ii) an aliphatic carbon compound, and iii) an aromatic carbon compound to produce a film on the substrate by plasma polymerization.

10. The method according to claim 9, further comprising:
    performing the delivering step after one of i) applying an adhesion-promoting film to the substrate, ii) plasma etching the substrate, and iii) plasma activating a surface of the substrate.

11. The method according to claim 9, wherein the delivering step further includes delivering doping elements to the plasma.

12. The method according to claim 9, wherein the delivering step is performed simultaneously with a PVD deposition operation.

13. The method according to claim 9, wherein after the delivering step, performing a PVD deposition operation.

14. The method according to claim 9, further comprising the step of:
    applying one of a pulsed bias voltage and an unpulsed bias voltage to the substrate to assist film deposition, the bias voltage being applied one of capacitively and by direct contact.

15. The method according to claim 9, further comprising the step of:
    producing metallic and nonmetallic dopants of the film via a PVD deposition operation performed one of concurrently with the plasma polymerization and subsequently with the plasma polymerization.

16. The method according to claim 9, further comprising the step of:
    producing metallic and nonmetallic dopants of the film via a PVD deposition operation performed subsequently to the plasma polymerization.

17. The method according to claim 9, further comprising the step of:
    providing a support film, made of a plasma polymer, between the substrate and the film, the support film having a thickness and providing a transition over the thickness from a relatively soft base level of the support film resting on the substrate to properties of the film, by depositing at least one of a silicon-organic compound, an aliphatic compound and an aromatic carbon compound, the support film having a quasi-continuous transition in modulus of elasticity from a first value of the base level of the support film to a second value of the film.

18. The method according to claim 17, further comprising the step of: producing metallic and nonmetallic dopants of the film via a PVD deposition operation performed subsequently to the plasma polymerization.

19. A component, comprising:
- a material susceptible to wear;
- a wear-resistant surface film containing at least one of carbon, nitrogen, silicon and boron, the at least one of the carbon, nitrogen, silicon and boron being at least 30% by atomic weight of the film; and
- a support film positioned between the material and the protective film, the support film having a thickness and providing a transition over the thickness from a relatively soft base level of the support film resting on the material to properties of the surface film, the support film being made of a plasma polymer deposited from at least one of a silicon-organic compound, an aliphatic compound and an aromatic carbon compound, the support film having a quasi-continuous transition in modulus of elasticity from a first value of the base level of the support film to a second value of the surface film.

20. The component according to claim 19, wherein the component is a technical device that includes a mechanical energy transfer mechanism.

* * * * *